United States Patent
Kim

(10) Patent No.: US 8,174,882 B2
(45) Date of Patent: *May 8, 2012

(54) METHOD OF PROGRAMMING A NON-VOLATILE MEMORY DEVICE FOR ENHANCING A CHANNEL BOOSTING OF A BIT LINE INHIBITED FROM PROGRAMMING

(75) Inventor: Ki Seog Kim, Seoul (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/226,148

(22) Filed: Sep. 6, 2011

(65) Prior Publication Data

US 2012/0002481 A1 Jan. 5, 2012

Related U.S. Application Data

(62) Division of application No. 12/163,033, filed on Jun. 27, 2008, now Pat. No. 8,036,028.

(30) Foreign Application Priority Data

Dec. 27, 2007 (KR) .................... 10-2007-0138682

(51) Int. Cl.
*G11C 16/04* (2006.01)
(52) U.S. Cl. .......... 365/185.02; 365/185.17; 365/185.18
(58) Field of Classification Search ............. 365/185.02, 365/185.09, 185.17, 185.18
See application file for complete search history.

(56) References Cited

U.S. PATENT DOCUMENTS

| 7,440,326 B2 * | 10/2008 | Ito | 365/185.18 |
| 7,684,256 B2 | 3/2010 | Kim | |
| 8,036,028 B2 * | 10/2011 | Kim | 365/185.02 |
| 2009/0168537 A1 | 7/2009 | Kim | |

FOREIGN PATENT DOCUMENTS

| KR | 1020060107697 | 10/2006 |
| KR | 1020070099988 | 10/2007 |
| KR | 1020090000332 | 1/2009 |

OTHER PUBLICATIONS

Korean Notice of Allowance for 10-2007-0138682.

* cited by examiner

*Primary Examiner* — Andrew Q Tran
(74) *Attorney, Agent, or Firm* — Lowe Hauptman Ham & Berner LLP

(57) ABSTRACT

A method of programming a non-volatile memory device includes applying a first pass voltage to word lines in a direction of a source select line based on a first word line selected for a program operation, wherein the word lines do not include a second word line adjacent to the first word line in a direction of the source select line; and applying a first voltage, a program voltage and a second pass voltage when the first pass voltage reaches a given level. The first voltage is applied to the second word line, the program voltage is provided to the first word line, and the second pass voltage is applied to word lines in a direction of a drain select line on the basis of the first word line.

6 Claims, 5 Drawing Sheets

US 8,174,882 B2

METHOD OF PROGRAMMING A NON-VOLATILE MEMORY DEVICE FOR ENHANCING A CHANNEL BOOSTING OF A BIT LINE INHIBITED FROM PROGRAMMING

CROSS-REFERENCES TO RELATED APPLICATIONS

The present application is a Divisional application of U.S. patent application Ser. No. 12/163,033, filed Jun. 27, 2008, which claims priority to Korean patent application number 10-2007-138682 filed on Dec. 27, 2007, which are incorporated by reference in its entirety.

BACKGROUND

The present invention relates to a method of programming a non-volatile memory device. More particularly, the present invention relates to a method of programming a non-volatile memory device for enhancing a channel boosting of a bit line of which programming is inhibited.

The demand has increased for a non-volatile memory device that electrically programs and erases data, wherein data is not erased even though power is not supplied to the non-volatile memory device.

A technique for highly integrating a memory cell has been developed to manufacture a mass storage memory device for storing a large amount of data.

This technique has been applied to NAND flash memory devices that includes a memory cell array having a plurality of cell strings, wherein memory cells are connected in serial in one cell string.

A memory cell in a flash memory device generally includes a gate, in which a tunnel insulating layer, a floating gate, a dielectric layer and a control gate are laminated on a semiconductor substrate, and a junction area formed to both sides of the gate on the semiconductor substrate. The memory device is programmed by injecting hot electrons into the floating gate, and is erased by discharging the injected hot electrons through an F-N tunneling.

FIG. 1 is a timing diagram illustrating voltages applied to word lines so as to program a flash memory device.

In FIG. 1, the flash memory device for performing a program operation includes a first word line WL<0> to a thirty-second word line WL<31>. Here, in case that the thirtieth word line WL<29> is selected for the program operation, a program voltage Vpgm is applied to the thirtieth word line WL<29>. In addition, a second pass voltage Vpass2 is applied to a thirty-first word line WL<30> and the thirty-second word line WL<31>, and a first pass voltage Vpass1 is provided to the first word line WL<0> to a twenty-ninth word line WL<28>.

The program operation is performed by injecting electrons in a channel region to the floating gate through a Fowler-Nordheim F-N tunneling due to high voltage difference of the channel region and the control gate in a selected memory cell, wherein the high voltage difference is generated by applying a voltage of 0V to a selected bit line and providing the program voltage Vpgm to a selected word line.

However, since the program voltage Vpgm is applied to non-selected memory cells as well as the selected memory cell disposed along the same word line, the non-selected memory cells are programmed.

This phenomenon is referred to as a program disturbance. To prevent this program disturbance, a source of a drain select transistor DST in a cell string having the non-selected memory cell connected to the selected word line and a non-selected bit line is charged to a level of (Vcc−Vth), Vcc is a power supply voltage and Vth is a threshold voltage of the drain select transistor DST, the program voltage Vpgm is applied to the selected word line, and the pass voltage Vpass is provided to the non-selected word line. As a result, a channel voltage Vch of the memory cells in the same cell string is boosted, and so the non-selected memory cell is not programmed.

A non-volatile memory device uses usually a sequential method of performing a program operation in a direction to the thirty-second word line WL<31> adjacent to a drain select line from the first word line WL<0> adjacent to a source select line.

Accordingly, in case that the twenty-ninth word line WL<28> is programmed in the program operation, a corresponding memory cell is not fully turned on by the first pass voltage Vpass 1, and so the channel voltage Vch is not adequately boosted. As a result, a disturbance phenomenon, that a non-selected memory cell is programmed, may be generated.

SUMMARY

It is a feature of the present invention to provide a method of programming a non-volatile memory device for adjusting an applying timing of voltages applied to word lines when a program operation is performed, thereby boosting adequately a channel voltage in a cell string of which programming is inhibited.

A method of programming a non-volatile memory device according to one example embodiment of the present invention includes applying a first pass voltage to word lines in a direction of a source select line on the basis of a first word line selected for a program operation, wherein the word lines do not include a second word line adjacent to the first word line in a direction of the source select line; and applying a first voltage, a program voltage and a second pass voltage when the first pass voltage reaches a predetermined level, wherein the first voltage is applied to the second word line, the program voltage is provided to the first word line, and the second pass voltage is applied to word lines in a direction of a drain select line based upon the first word line.

The first voltage is applied so that a memory cell, coupled to the second word line in a cell string not be programmed, is turned off by a channel voltage boosted by the first pass voltage.

The predetermined level is a level between about 6V and about 7.5V.

A voltage of 0V is applied to a bit line coupled to a memory cell to be programmed, and a power supply voltage is provided to a bit line coupled to a memory cell inhibited from being programmed.

A voltage of 0V is applied to the source select line.

A method of programming a non-volatile memory device according to another example embodiment of the present invention includes applying a program voltage to a first word line selected for a program operation, providing a first voltage to a second word line adjacent to the first word line in a source select line, applying a first pass voltage to a third set of word lines in a direction of the source select line relative to the first word line, and applying a second pass voltage to a fourth set word lines in a direction of a drain select line relative to the first word line; and applying a voltage to a bit line in accordance with data to be programmed in a memory cell, and performing the program operation.

The first voltage is applied so that a memory cell coupled to the second word line is turned off by a channel voltage boosted by the first pass voltage, and wherein programming of the memory cell coupled to the second word line is inhibited.

A voltage of about 0V is applied to a bit line coupled to a memory cell to be programmed, and a power supply voltage is provided to a bit line coupled to a memory cell inhibited from being programmed.

A voltage of about 0V is applied to the source select line.

As described above, a method of programming a nonvolatile memory device of the present invention adjusts properly an applying timing of voltages applied to word lines when a program operation is performed, thereby increasing a boosting level of a channel in a cell string of which programming is inhibited. As a result, a program disturbance may be prevented.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 1:
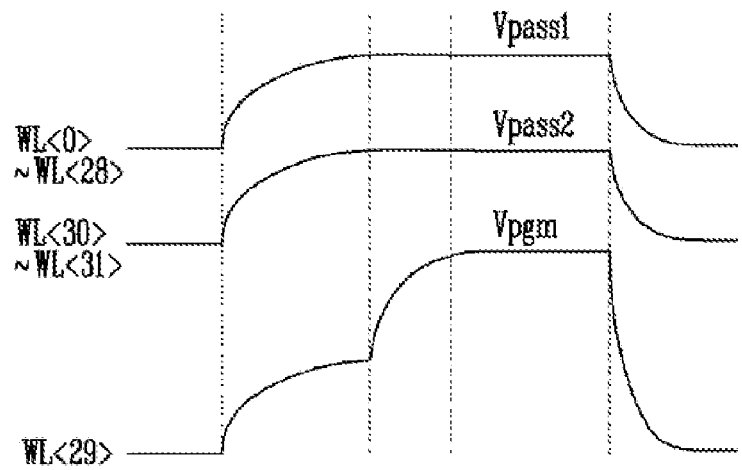
FIG. 1 is a timing diagram illustrating voltages applied to word lines so as to program a flash memory device.
Figure 2A:
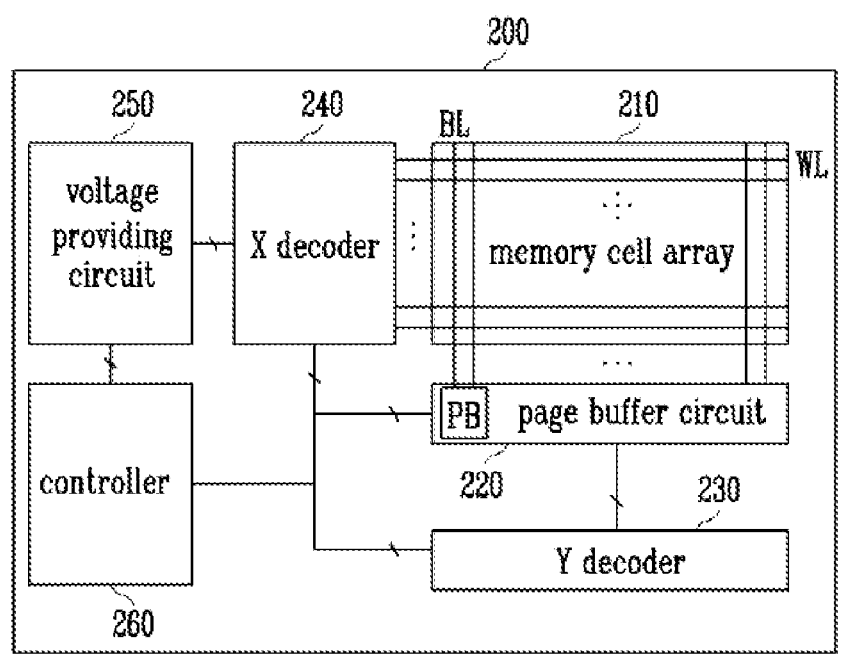
FIG. 2A is a block diagram illustrating a flash memory device.

FIG. 2A is a block diagram illustrating a flash memory device.

In FIG. 2A, the flash memory device 200 includes a memory cell array 210, a page buffer circuit 220, an Y decoder 230, an X decoder 240, a voltage providing circuit 250 and a controller 260.

The memory cell array 210 has a plurality of cell strings in which memory cells for storing data are coupled in serial. Here, each of the cell strings is coupled to a corresponding bit line BL. In addition, gates of the memory cells are coupled to a corresponding word line WL vertical to the bit line BL.

The page buffer circuit 220 includes a plurality of page buffers coupled to the bit line BL of the memory cell array 210.

Each of the page buffer stores temporarily data to be programmed to a selected memory cell and transmits the stored data to the memory cell through the bit line BL, or reads data stored in a memory cell and stores the read data.

The Y decoder 230 provides input/output path to the page buffer of the page buffer circuit 220 in accordance with an input address.

The X decoder 240 selects a word line of the memory cell array 210 in accordance with the input address.

The voltage providing circuit 250 generates an operation voltage to be applied to a word line coupled to the X decoder 240 in accordance with control of the controller 260.

The controller 260 outputs a control signal in accordance with an operation command, and controls the voltage providing circuit 250 so that a pass voltage is applied to a corresponding word line in accordance with data program of the memory cell array 210.

Figure 2B:
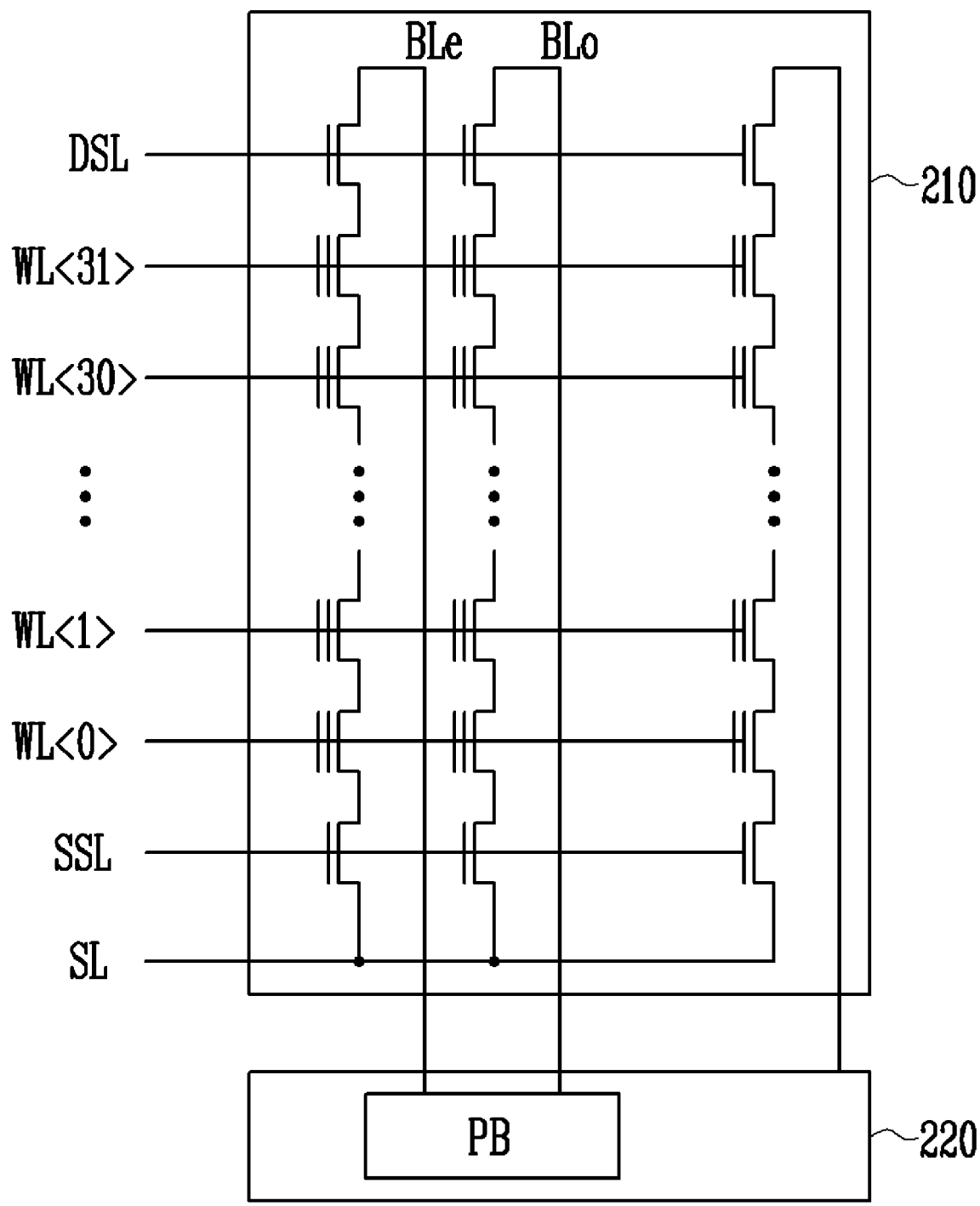
FIG. 2B is a view illustrating a circuitry of the memory cell array in FIG. 2A.

FIG. 2B is a view illustrating a circuitry of the memory cell array in FIG. 2A.

In FIG. 2B, the memory cell array 210 includes a first word line WL<0> to a thirty-second word line WL<31>.

One cell string has thirty two memory cells disposed in serial between a drain select transistor DST and a source select transistor SST.

A gate of the drain select transistor DST is coupled to a drain select line DSL, and a gate of a source select transistor SST is coupled to a source select line SSL.

Gates of each memory cells are coupled to the first word line WL<0> to the thirty-second word line WL<31>.

Voltages for a program operation in the above flash memory device may be applied to corresponding word line as described below.

Figure 3A:
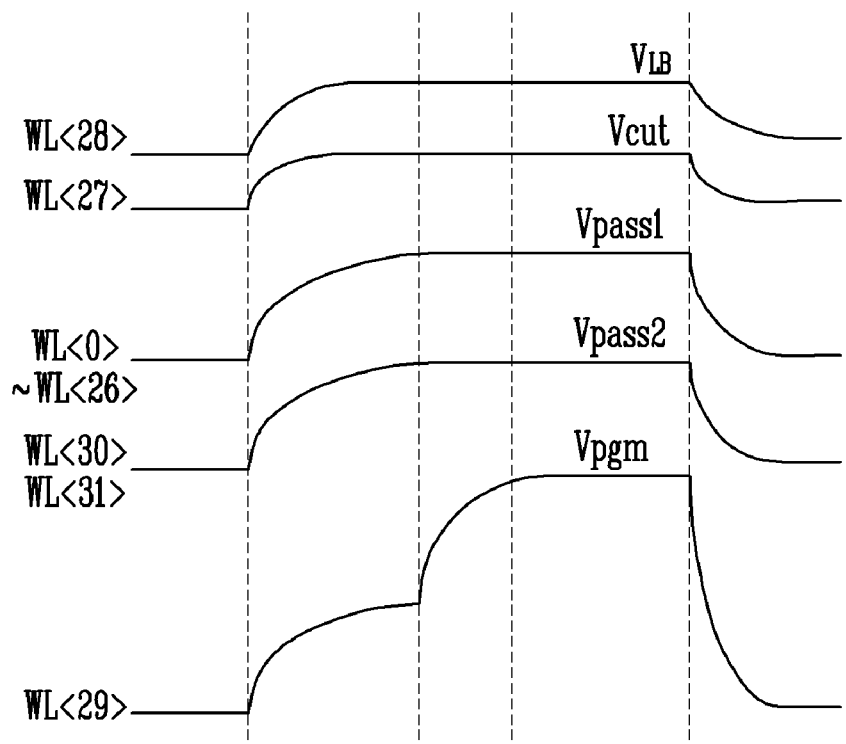
FIG. 3A is a timing diagram illustrating a process of applying the program voltage in the flash memory device.

FIG. 3A is a timing diagram illustrating a process of applying the program voltage in the flash memory device.

In FIG. 3A, in case that a thirtieth word line WL<29> is a word line selected for the program operation of the word lines WL<0> to WL<31>, a program voltage Vpgm is applied to the thirtieth word line WL<29>.

In addition, a second pass voltage Vpass2 is applied to the thirty-first word line WL<30> and the thirty-second word line WL<31> in a direction of a drain select line on the basis of the thirtieth word line WL<29>.

Furthermore, a low bias voltage VLB is applied to the twenty-ninth word line WL<28> in a direction of a source select line on the basis of the thirtieth word line WL<29>, a cut voltage Vcut is provided to the twenty-eighth word line WL<27>, and a first pass voltage Vpass1 is applied to the other word lines WL<0> to WL<26>.

The first pass voltage Vpass1 is more than the second pass voltage Vpass2.

0V is applied to a bit line of a cell string for the program operation, and a power supply voltage is provided to a bit line of cell string not programmed.

TABLE 1

| WL | Vt | Vg | Vch |
|---|---|---|---|
| WL<0> | −1.24 | | 4.86 |
| ... | ... | | ... |
| WL<24> | 8.69 | | 4.86 |
| WL<25> | 0.11 | 2.5 | 0 |
| WL<26> | 0.40 | 5 | 0 |
| WL<27> | −1.24 | | 5.98 |
| WL<28> | 8.06 | | 0 |
| WL<29> | −2.00 | 28 | 15.95 |
| WL<30> | −2.00 | | 0 |
| WL<31> | −2.00 | | 0 |

Table 1 shows schematically a boosting voltage level of each word lines in a programmed cell string in which the twenty-ninth word line WL<28> has high threshold voltage.

Referring to Table 1, in case that a threshold voltage Vt of a memory cell coupled to the twenty-ninth word line WL<28> has high level as 8.06V, voltages are applied to corresponding word line as shown in FIG. 3A. As a result, a channel voltage Vch of the thirtieth word line WL<29> is boosted up to 15.95V, and so a memory cell coupled the word line WL<29> is not programmed though a voltage of 28V is applied to a gate of the memory cell coupled to the word line WL<29> as shown in Table 1.

However, a problem may be occurred in case that the memory cell coupled to the twenty-ninth word line WL<28> has erase status when the voltages shown in FIG. 3A are applied to corresponding word line.

TABLE 2

| WL | Vt | Vg | Vch |
|---|---|---|---|
| WL<0> | 4 | | 4.39 |
| ... | ... | | ... |
| WL<24> | 4 | | 4.39 |
| WL<25> | −2 | 2.5 | 0 |
| WL<26> | −2 | 5 | 6.35 |
| WL<27> | −2 | | 6.35 |
| WL<28> | −2 | | 6.35 |
| WL<29> | −2 | 28 | 6.35 |
| WL<30> | −2 | | 6.35 |
| WL<31> | −2 | | 6.35 |

Table 2 shows channel voltages Vch in case that the memory cell coupled to the twenty-ninth word line WL<28> is an erased memory cell.

In Table 2, a channel is not turned off, and so boosting of a channel voltage Vch is lowered. As a result, the channel voltage Vch of the thirtieth word line WL<29> is low, and thus the memory cell coupled to the thirtieth word line WL<29> may be programmed.

Figure 3B:
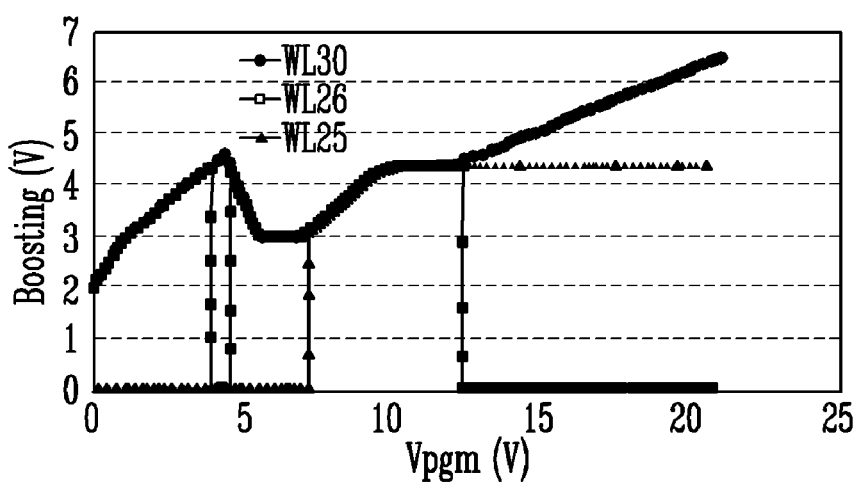
FIG. 3B is a view illustrating a boosting level of a memory cell when the voltage in FIG. 3A is applied.

FIG. 3B is a view illustrating a boosting level of a memory cell when the voltage in FIG. 3A is applied.

In FIG. 3B, since a boosting level of word lines before the twenty-eighth word line WL<27> is considerably low, a corresponding channel is not turned off. As a result, a phenomenon that the channel voltage Vch of the thirtieth word line WL<29> is lowered may be occurred.

This phenomenon is occurred because the cut voltage Vcut applied to the twenty-eighth word line WL<27> is higher than a voltage boosted in a programmed area. Accordingly, the channel may be turned off in case that the word lines before the twenty-eighth word line WL<27> are adequately boosted.

However, since the above phenomenon may be also occurred in case that the word lines WL<0> to WL<26> are erased, a channel voltage Vch of a cell string may be excessively boosted, and so a program disturbance may be occurred to the memory cell coupled to the twenty-seventh word line WL<26>.

TABLE 3

| WL | Vt | Vg | Vch |
|---|---|---|---|
| WL<0> | −2 | | 8.34 |
| ... | ... | | ... |
| WL<24> | −2 | | 8.34 |
| WL<25> | −2 | 2.5 | 0 |
| WL<26> | −2 | 5 | 0 |
| WL<27> | −2 | | 11 |
| WL<28> | −2 | | 0 |
| WL<29> | −2 | 28 | 13.66 |
| WL<30> | −2 | | 0 |
| WL<31> | −2 | | 0 |

That is, in case that memory cells coupled to the word lines WL<0> to WL<27> are erased cells, the channel voltage Vch is excessively boosted.

Accordingly, the flash memory device of the present invention uses a following method of applying voltages to the word lines.

Figure 4A:
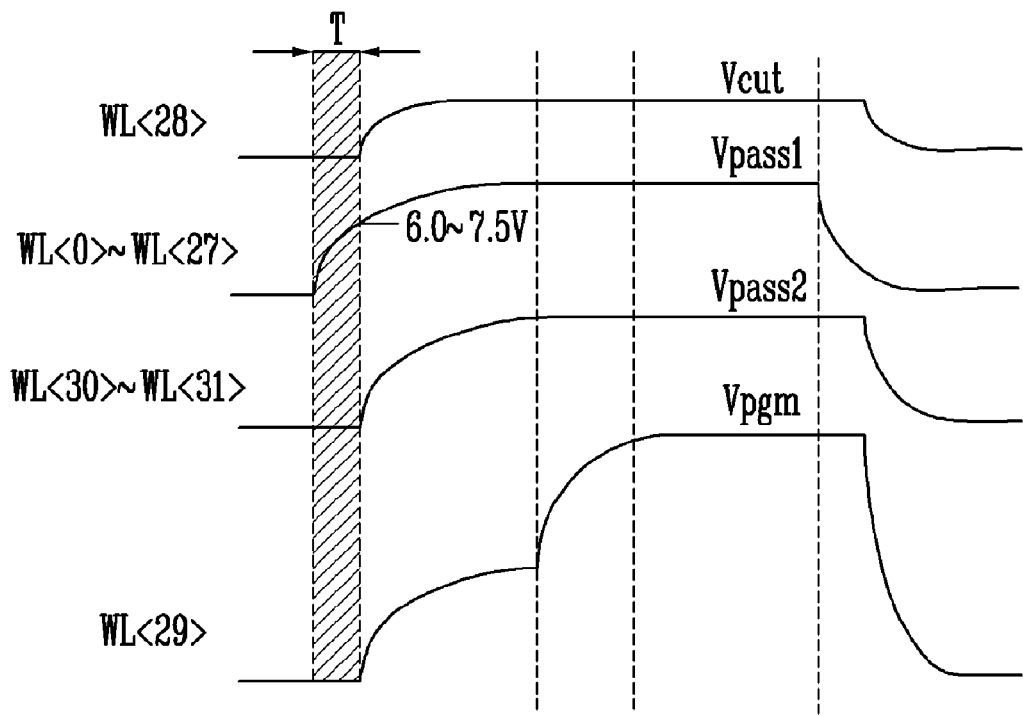
FIG. 4A is a timing diagram illustrating voltage applied to the word lines according to one example embodiment of the present invention.

FIG. 4A is a timing diagram illustrating voltage applied to the word lines according to one example embodiment of the present invention.

In FIG. 4A, in case that the thirtieth word line WL<29> is a word line selected for a program operation, a first pass voltage Vpass1 is applied to the word lines WL<0> to WL<27>.

Subsequently, a cut voltage Vcut, a second pass voltage Vpass2 and a program voltage Vpgm are applied to corresponding word line after a given period of time T in which a channel between the word lines WL<0> to WL<27> is boosted. Wherein the cut voltage Vcut is applied to the word line WL<28> and the second pass voltage Vpass2 is applied to the word lines WL<30> to WL<31> and the program voltage Vpgm is supplied to the word line WL<29>. Here, in case that a back pattern, i.e. memory cells coupled to the word lines WL<0> to WL<28> have erase status, a boosting level of the channel is excessively increased. Additionally, in case that the cut voltage Vcut is applied too late, the disturbance phenomenon may be occurred to the memory cell coupled to the twenty-seventh word line WL<26>.

Figure 4B:
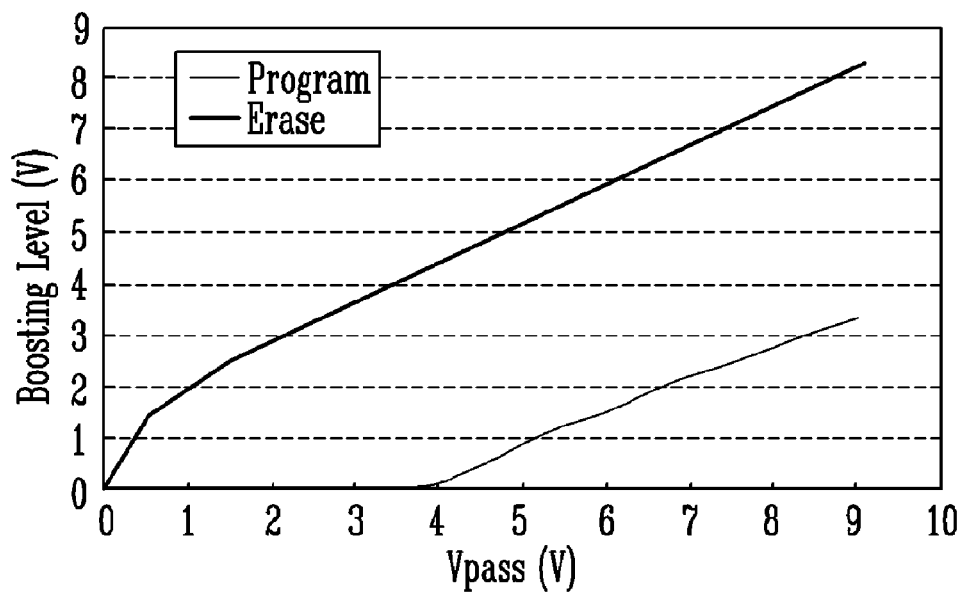
FIG. 4B is a view illustrating a boosting level in accordance with program or erase of a back pattern.

FIG. 4B is a view illustrating a boosting level in accordance with program or erase of a back pattern.

In FIG. 4B, in case that the back pattern corresponds to a programmed memory cell, the cut voltage Vcut, the second pass voltage Vpass2 and the program voltage Vpgm are applied to corresponding word lines after the first pass voltage Vpass1 is increased up to above 6V. In this case, a channel of the memory cell coupled to the twenty-eighth word line WL<27> may be turned off.

In addition, in case that the back pattern corresponds to an erased memory cell, the disturbance phenomenon may be occurred to the memory cell coupled to the twenty-seventh word line WL<26> because the channel is boosted at above 7.5V to above 7V by the first pass voltage Vpass1.

Accordingly, to optimize the channel boosting, an applying timing of the voltages Vcut, Vpass2 and Vpgm is adjusted so that the first pass voltage Vpass1 is started at 6V to 7.5V.

Figure 4C:
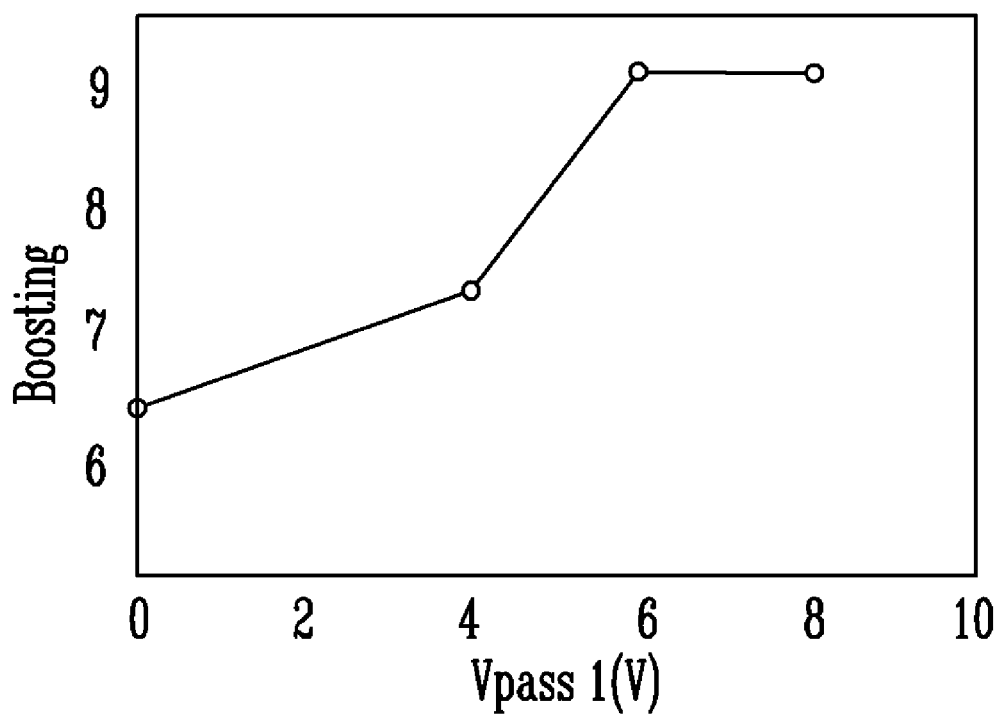
FIG. 4C is a view illustrating a boosting level in accordance with the first pass voltage.

FIG. 4C is a view illustrating a boosting level in accordance with the first pass voltage.

Referring to FIG. 4C, it is verified that efficiency of the boosting level is maximized when the first pass voltage Vpass1 reaches 6V.

A timing for applying the voltages Vcut, Vpass2 and Vpgm after the first pass voltage Vpass1 is applied may be experimentally adjusted in accordance with characteristic of the memory cell.

In addition, to apply simultaneously every voltage to corresponding word lines without delayed, a method of adjusting, i.e. increasing the cut voltage Vcut to above 0V when the first pass voltage Vpass1 is augmented to about desired level by applying the cut voltage Vcut having negative level.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of programming a non-volatile memory device, the method comprising:
    applying a program voltage to a first word line selected for a program operation;
    applying a first voltage to a second word line adjacent to the first word line in a direction of a source select line;
    applying a first pass voltage to a third set of word lines in the direction of the source select line relative to the first word line;
    applying a second pass voltage to a fourth set of word lines in a direction of a drain select line relative to the first word line; and
    applying a voltage to a bit line in accordance with data to be programmed in a memory cell, and performing the program operation,
    wherein the applying a first voltage, the applying a program voltage, and the applying a second pass voltage are performed when the first pass voltage reaches a predetermined level.

2. The method of claim 1,
    wherein the first voltage is applied so that a memory cell coupled to the second word line is turned off by a channel voltage boosted by the first pass voltage; and
    wherein programming of the memory cell coupled to the second word line is inhibited.

3. The method of claim 1, further comprising:
    applying a voltage of about 0V to the bit line coupled to the memory cell to be programmed; and
    applying a power supply voltage to a bit line coupled to a memory cell inhibited from being programmed.

4. The method of claim 1, wherein a voltage of about 0V is applied to the source select line.

5. The method of claim 1, wherein the first voltage is a cut voltage.

6. The method of claim 1, wherein the first pass voltage is more than the second pass voltage.

* * * * *